(12) United States Patent
Taniguchi et al.

(10) Patent No.: US 7,776,151 B2
(45) Date of Patent: Aug. 17, 2010

(54) METHOD AND APPARATUS FOR FORMING CRYSTALLINE PORTIONS OF SEMICONDUCTOR FILM

(75) Inventors: Yukio Taniguchi, Yokohama (JP); Masakiyo Matsumura, Yokohama (JP)

(73) Assignee: Advanced LCD Technologies Development Center Co., Ltd., Totsuka-ku (JP)

( * ) Notice: Subject to any disclaimer, the term of this patent is extended or adjusted under 35 U.S.C. 154(b) by 320 days.

(21) Appl. No.: 11/866,577

(22) Filed: Oct. 3, 2007

(65) Prior Publication Data
US 2008/0032244 A1    Feb. 7, 2008

Related U.S. Application Data

(62) Division of application No. 10/802,836, filed on Mar. 18, 2004, now Pat. No. 7,311,771.

(30) Foreign Application Priority Data
Mar. 28, 2003    (JP) .............................. 2003-089545

(51) Int. Cl.
*C30B 1/02*    (2006.01)
(52) U.S. Cl. .................... 117/4; 117/5; 117/8; 117/9
(58) Field of Classification Search .................. 117/4, 117/5, 8, 9
See application file for complete search history.

(56) References Cited

U.S. PATENT DOCUMENTS 6,870,126 B2    3/2005    Jyumonji et al.

OTHER PUBLICATIONS

U.S. Appl. No. 12/425,212, filed Apr. 16, 2009, Matsumura, et al.

Chang-Ho Oh, et al., Japan Journal of Applied Physics, vol. 37 pp. L492-L495, "A Novel Phase-Modulated Excimer-Laser Crystallization Method of Silicon Thin Films", May 1, 1998.

M. Nakata, et al., The Japan Society of Applied Physics, vol. 40, part 1, No. 5, pp. 3049-3054, "A New Nucleation-Site-Control Excimer-Laser-Crystallization Method", May 2001.

M. Matsumura, IDW ' 02 AMD5-1, pp. 263-266, "Advanced Laser-Crystallization Technologies of Si for High-Performance TFTs", 2001.

International Display Workshop, pp. 1-6, "Advanced Laser-Crystallization Technologies of Si for High-Performance TFTs", (with partial English Translation) 2 (2002).

Journal of The Surface Science Society of Japan, vol. 21, No. 5, pp. 278-287, "Preparation of Ulta-Large Grain Silison Thin Films by Excimer-Laser", 2000 (with partial English Translation).

*Primary Examiner*—Robert M Kunemund
(74) *Attorney, Agent, or Firm*—Oblon, Spivak, McClelland, Maier & Neustadt, L.L.P.

(57) ABSTRACT

A crystallization method which generates a crystallized semiconductor film by irradiating at least one of a polycrystal semiconductor film and an amorphous semiconductor film with light beams having a light intensity distribution with an inverse peak pattern that a light intensity is increased toward the periphery from an inverse peak at which the light intensity is minimum, wherein a light intensity value $\alpha$ (standardized value) in the inverse peak when a maximum value of the light intensity in the light intensity distribution with the inverse peak pattern is standardized as 1 is set to $0.2 \leq$ value $\alpha \leq 0.8$.

2 Claims, 11 Drawing Sheets

METHOD AND APPARATUS FOR FORMING CRYSTALLINE PORTIONS OF SEMICONDUCTOR FILM

CROSS-REFERENCE TO RELATED APPLICATIONS

This application is a divisional application of U.S. application Ser. No. 10/802,836, filed Mar. 18, 2004, and is based upon and claims the benefit of priority from prior Japanese Patent Application No. 2003-89545, filed Mar. 28, 2003, the entire contents of which are incorporated herein by reference.

BACKGROUND OF THE INVENTION

1. Field of the Invention

The present invention relates to a crystallization apparatus and a crystallization method. More particularly, the present invention relates to a crystallization apparatus and a crystallization method for forming a crystallized semiconductor film by irradiating a polycrystal semiconductor film or an amorphous semiconductor film with laser beams having a predetermined light intensity distribution.

2. Description of the Related Art

A thin film transistor (TFT) which is used in a switching element or the like which controls a voltage to be applied to pixels of, e.g., a liquid crystal display (LCD) is formed to an amorphous silicon or polysilicon layer.

A polysilicon layer has a higher electron mobility than that of amorphous silicon. Therefore, when a transistor is formed to the polysilicon layer, a switching speed and a display response are faster than those in cases where the transistor is formed to the amorphous silicon. Further, a peripheral LSI can be constituted of a thin film transistor. Furthermore, there is an advantage that a design margin of any other component can be decreased. Moreover, peripheral circuits such as a driver circuit or a DAC can be operated at higher speeds when they are incorporated in a display.

Although the polysilicon is formed of an aggregation of one-crystal grains, its electron mobility is lower than that of single-crystal silicon. Additionally, a thin film transistor formed to the polycrystal silicon has a problem of irregularities in crystal grain boundary number in a channel portion.

Thus, in recent years, in order to improve the electron mobility and reduce irregularities in crystal grain boundary number in the channel portion, there has been proposed a crystallization method which generates crystallized silicon with a large particle size.

As this type of crystallization method, there is known a "Phase Control Excimer Laser Annealing (ELA method)" which generates a crystallized semiconductor film by irradiating a phase shifter which is caused to be in contiguity with a polycrystal semiconductor film or an amorphous semiconductor film in parallel with excimer laser beams. The details of the phase control ELA are disclosed in, e.g., "Surface Science Vol. 21, No. 5, pp. 278-287, 2000".

In the phase control ELA, a light intensity distribution with an inverse peak pattern that a light intensity is substantially zero at a point corresponding to a phase shift portion of a phase shifter is generated, and a polycrystal semiconductor film or an amorphous semiconductor film is irradiated with the light beams having this light intensity distribution with the inverse peak pattern. It is to be noted that the inverse peak pattern is defined as a pattern that a light intensity is substantially zero at the center and the light intensity is suddenly increased toward the periphery. As a result, a temperature gradient is generated in a fusion area in accordance with the light intensity distribution, and a crystal nucleus is formed at a part which is solidified first in accordance with the point where the light intensity is substantially zero. Therefore, a crystal grows in a lateral direction from that crystal nucleus toward the periphery (which will be referred to as a "lateral growth" hereinafter), thereby generating single-crystal grains with a large particle size.

Meanwhile, a phase shifter which is generally used in the prior art is a line type phase shifter, and comprises two rectangular areas which are alternately repeated along one direction. A phase difference of π (180 degrees) is given between the two alternately repeated areas.

Figure 11A:
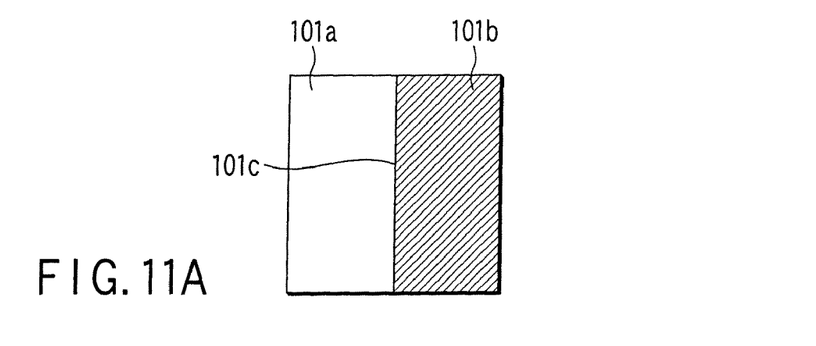
FIGS. 11A to 11C are schematic views illustrating a structure and an effect of a line type phase shifter.
Figure 11B:
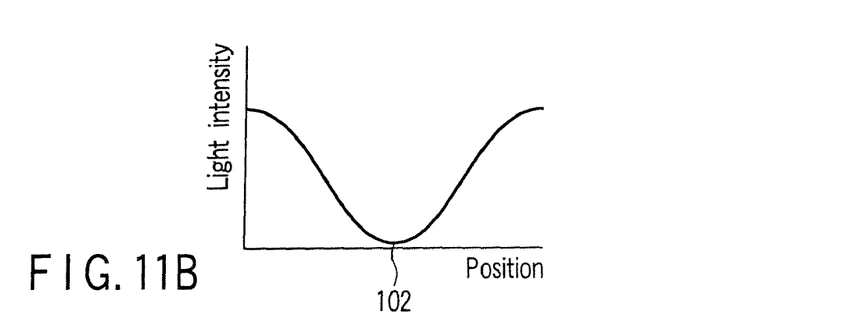
Figure 11C:
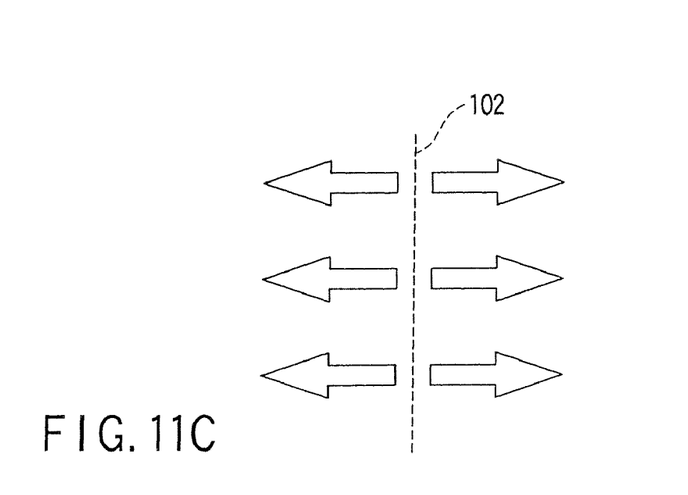

FIGS. 11A to 11C are views illustrating a structure and an effect of a line type phase shifter. When the line type phase shifter is used, as shown in FIG. 11A, a linear border line 101c between two areas 101a and 101b having a phase difference of, e.g., 180 degrees constitutes a phase shift line. Therefore, as shown in FIG. 11B, there is formed a light intensity distribution with an inverse peak pattern that a light intensity is substantially zero on a line 102 corresponding to the phase shift line and the light intensity is one-dimensionally increased toward the periphery in a direction orthogonal to the line 102. In this case, as shown in FIG. 11C, a temperature distribution becomes lowest along the line 102 corresponding to the phase shift line, and a temperature gradient (indicated by arrows) is generated along the direction orthogonal to the line 102 corresponding to the phase shift line. As a result, a crystal nucleus is generated in the vicinity of the line 102 corresponding to the phase shift line, and crystallization advances from that crystal nucleus along the line orthogonal to the line 102 corresponding to the phase shift line.

Figure 12A:
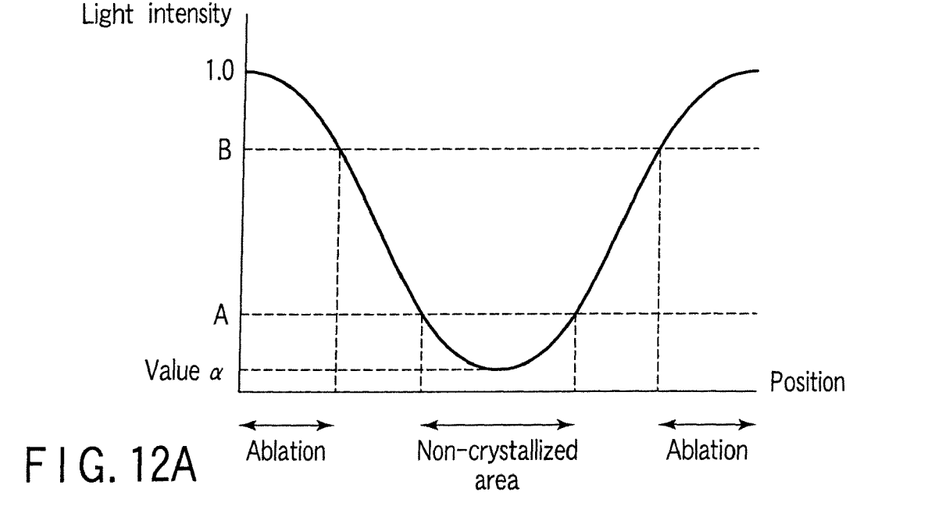
FIGS. 12A to 12C are schematic views illustrating inconveniences when light beams having a light intensity distribution with an inverse peak pattern given thereto are used.
Figure 12B:
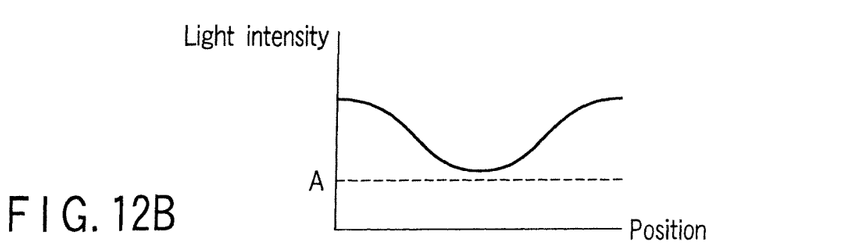

FIGS. 12A to 12C are views illustrating inconveniences when using light beams to which a light intensity distribution with an inverse peak pattern obtained by a use of the phase shifter depicted in FIG. 11A is given. As shown in FIG. 12A, in an area where the light intensity is not more than a reference intensity A, amorphous silicon does not change and remains in an amorphous silicon state, or it remains in a polysilicon state even if it is fused. As a result, the crystal growth does not start (a state including this amorphous state and the polysilicon state will be referred to as a "non-crystallized area" hereinafter for convenience's sake). It can be considered that a peripheral portion of this non-crystallized area becomes a crystal nucleus and a crystal grows from there. Therefore, the first importance is the light intensity in an inverse peak value (point where the minimum light intensity is minimum), i.e., a value α when the maximum value of the light intensity in the light intensity distribution with the inverse peak pattern is standardized as 1. Incidentally, as shown in FIG. 12B, when the value α exceeds the reference intensity A and becomes too large, the temperature gradient becomes small, and hence there is a problem that the crystal growth tends to stop halfway.

Figure 12C:
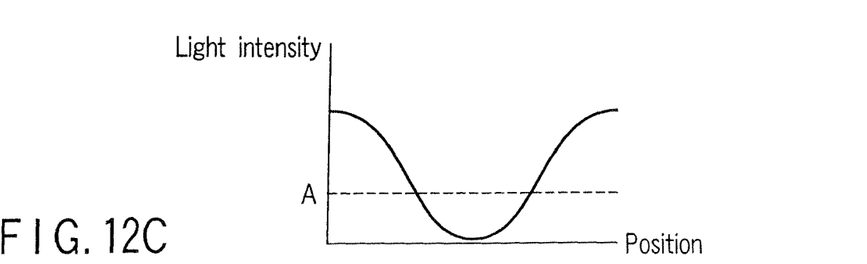

Generally, in the prior art using, e.g., the line type phase shifter, as shown in FIG. 12C, the value α becomes too small as compared with the first reference intensity A and the non-crystallized area tends to become large. Considering that the phase shift line (shown in FIG. 11C) is arranged with a fixed pitch, it is hard to obtain a crystal with a large particle size. Additionally, as shown in FIG. 12A, in an area where the light intensity is not less than a second reference intensity B, an amorphous silicon semiconductor is lost or destructed due to ablation (transpiration). Since the value α is adjusted based on a shape of the phase shifter or optical conditions in the prior art in this manner, adjusting the value α also changes properties of the light intensity distribution. Therefore, it is difficult to obtain a desired light intensity distribution in order to realize the sufficient lateral growth from a crystal nucleus.

BRIEF SUMMARY OF THE INVENTION

It is an object of the present invention to provide a crystallization apparatus and a crystallization method which can assuredly cause a lateral growth of a crystal from a crystal nucleus and generate a semiconductor film having a crystal structure with a large particle size without substantially producing ablation.

According to an aspect of the present invention, there is provided a crystallization apparatus which generates a crystallized semiconductor film by irradiating at least one of a polycrystal semiconductor film and an amorphous semiconductor film with light beams having a predetermined light intensity distribution, comprising:

an irradiation system which is used to irradiate at least one of the polycrystal semiconductor film or the amorphous semiconductor film with light beams having a light intensity distribution with an inverse peak pattern that a light intensity is increased toward the periphery from an inverse peak at which the light intensity is minimum, wherein a light intensity value $\alpha$ (standardized value) of the inverse peak when a maximum value of the light intensity in the light intensity distribution with the inverse peak pattern is standardized as 1 falls within a range of $0.2 \leq$ value $\alpha \leq 0.8$.

With this structure, a desired light intensity distribution which can realize the sufficient lateral growth of a crystal from a crystal nucleus can be obtained based on a relatively small amorphous area without substantially generating ablation.

According to another aspect of the present invention, there is provided a crystallization method which generates a crystallized semiconductor film by irradiating at least one of a polycrystal semiconductor film and an amorphous semiconductor film with light beams having a light intensity distribution with an inverse peak pattern that a light intensity is increased toward the periphery from an inverse peak at which the light intensity is minimum, wherein a light intensity value $\alpha$ (standardized value) in the inverse peak when a maximum value of the light intensity in the light intensity distribution with the inverse peak pattern is standardized as 1 is set to $0.2 \leq$ value $\alpha \leq 0.8$.

With this structure, a desired light intensity distribution which can realize the sufficient lateral growth of a crystal from a crystal nucleus can be obtained based on a relatively small amorphous area without substantially generating ablation.

According to still another aspect of the present invention, there is provided a crystallization method which generates a crystallized semiconductor film by irradiating at least one of a polycrystal semiconductor film and an amorphous semiconductor film with light beams having a predetermined light intensity, comprising:

irradiating a predetermined area of at least one of the polycrystal semiconductor film and the amorphous semiconductor film with light beams having a substantially homogeneous light intensity distribution; and irradiating the predetermined area with light beams having a light intensity distribution with an inverse peak pattern that a light intensity is increased toward the periphery from an area in which the light intensity is minimum concurrently with at least light beams having the homogeneous light intensity distribution or within a range of a predetermined time difference.

With this structure, a desired light intensity distribution which can realize the sufficient lateral growth of a crystal from a crystal nucleus can be obtained based on a relatively small amorphous area without substantially generating ablation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment according to the present invention will now be described hereinafter with reference to the accompanying drawings.

Figure 1:
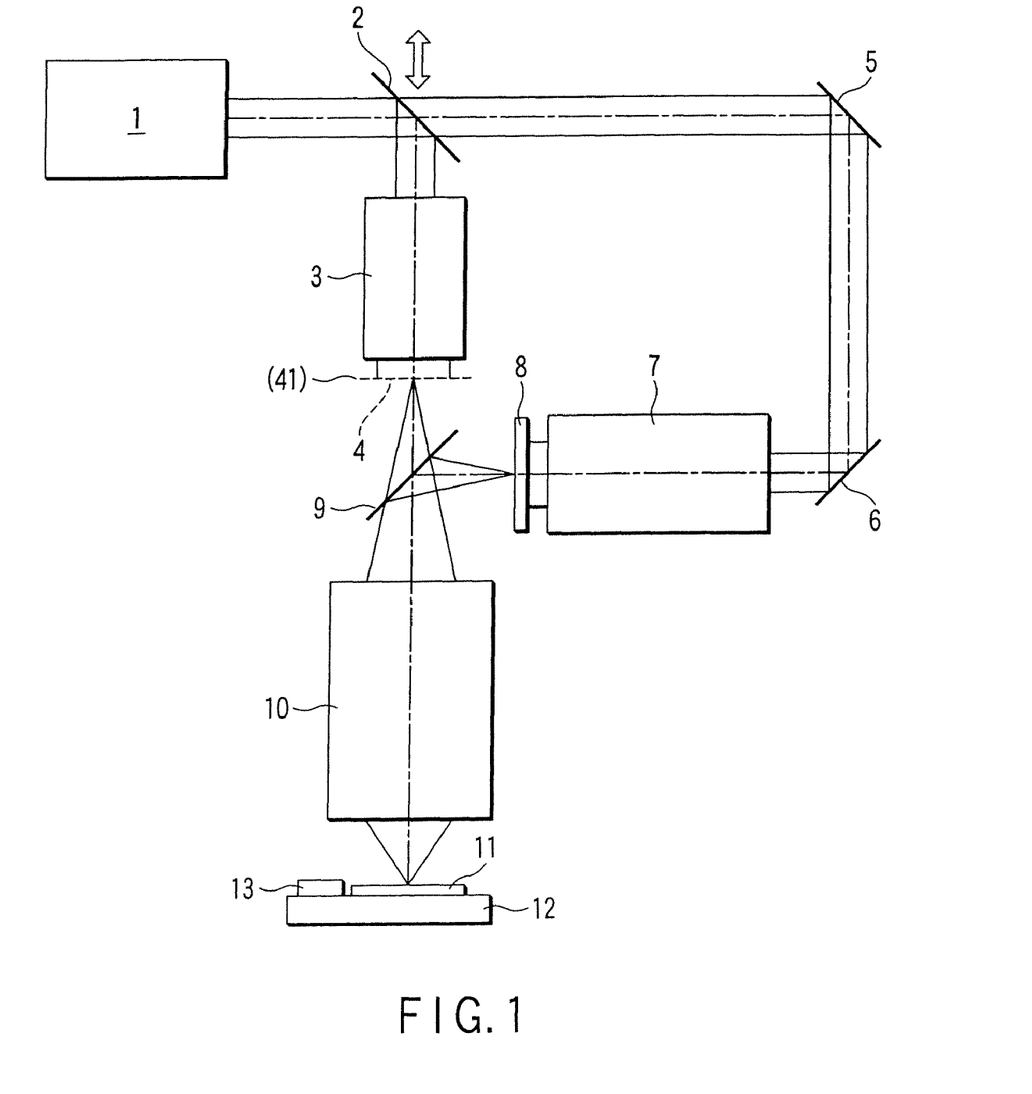
FIG. 1 is a schematic view illustrating an example of a structure of a crystallization apparatus according to an embodiment of the present invention.
Figure 2:
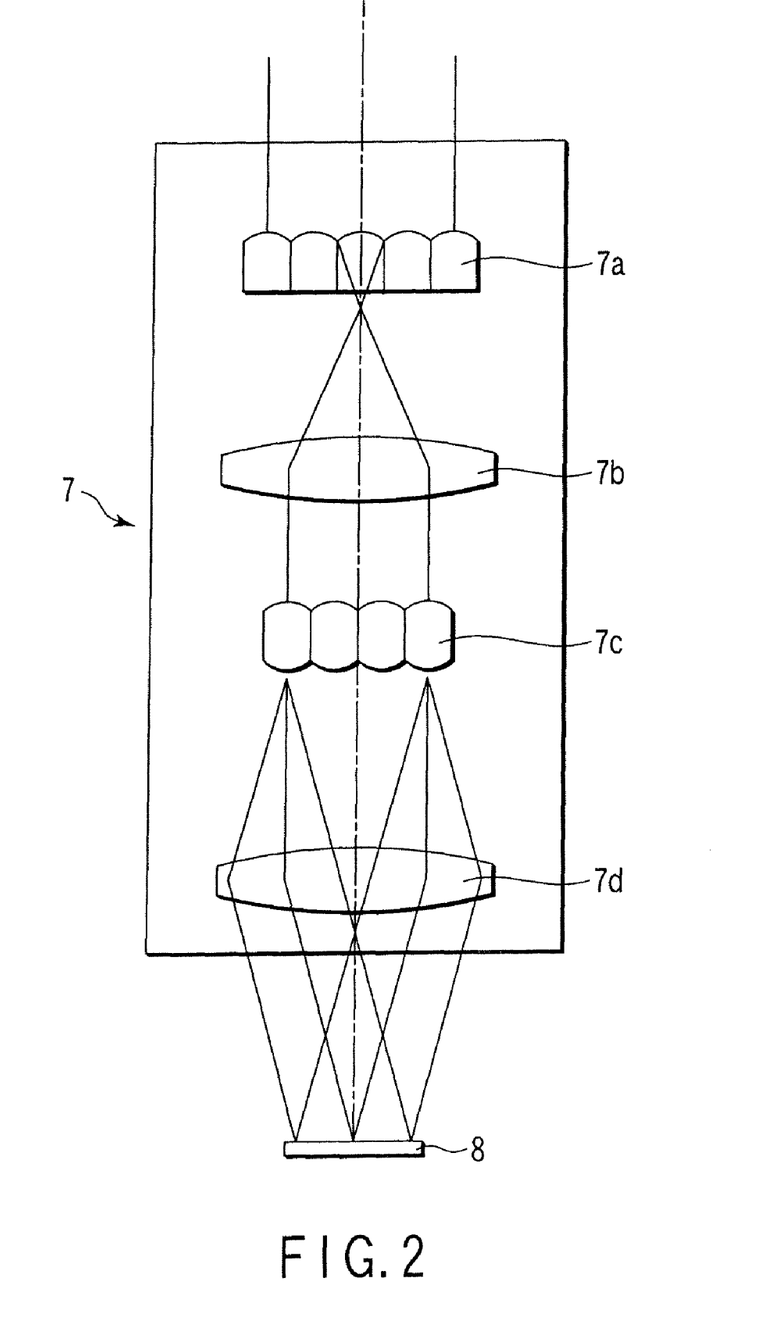
FIG. 2 is a schematic view showing an example of an internal structure of a second illumination optical system depicted in FIG. 1.

FIG. 1 schematically shows a structure of a crystallization apparatus according to the embodiment of the present invention. FIG. 2 schematically shows an internal structure of a second illumination optical system depicted in FIG. 1. The crystallization apparatus according to this embodiment comprises a KrF excimer laser beam source 1 which supplies light beams having a wavelength of, e.g., 248 nm. It is to be noted that any other appropriate beam source such as an excimer laser beam source of, e.g., KrF or XeCl or a YAG laser beam source can be also used.

Laser beams supplied from the beam source 1 enter light beam dividing means, e.g., a beam splitter 2 which is utilized as an intensity ratio varying means. The beam splitter 2 is configured so as to be detachable with respect to a light path, and it can be replaced with another beam splitter having a different reflectance as will be described later in conjunction with FIG. 4A. The laser beams reflected by the beam splitter 2 substantially evenly illuminate a predetermined surface (corresponding to a virtual beam source, indicated by a wavy line) through a first illumination optical system 3. The laser beams transmitted through the beam splitter 2 are sequentially reflected by two mirrors 5 and 6, and then substantially evenly illuminate a phase shifter 8 as a light beam modulation element through the second illumination optical system 7. It is to be noted that the phase shifter 8 is an optical member capable of mainly providing a phase lag (advance), i.e., a phase difference in accordance with an arbitrary area with respect to the light beams to be transmitted.

Referring to FIG. 2, in the second illumination optical system 7, the light beams which have entered a first fly-eye lens 7a form a plurality of beam sources on a rear focal plane of this lens. Light fluxes from the plurality of beam sources formed on the rear focal plane of the first fly-eye lens 7a illuminate an incident surface of a second fly-eye lens 7c in the overlapping manner through a first condenser optical system 7b. As a result, more beam sources than those on the rear focal plane of the first fly-eye lens 7a are formed on the rear focal plane of the second fly-eye lens 7c.

Light fluxes from the plurality of beam sources formed on the rear focal plane of the second fly-eye lens 7c illuminate, e.g., a line type phase shifter 8 in the overlapping manner through a second condenser optical system 7d. The first fly-eye lens 7a and the first condenser optical system 7b constitute a first homogenizer which is used to homogenize the laser beams from the beam splitter 2. This first homogenizer achieves homogenization concerning an incident angle on the phase shifter 8.

The second fly-eye lens 7c and the second condenser optical system 7d constitute a second homogenizer, and this second homogenizer achieves homogenization concerning an in-plane position on the phase shifter 8. Therefore, the phase shifter 8 is illuminated with light beams having a substantially homogenous light intensity distribution through the second illumination optical system 7.

In the first illumination optical system 3, it is possible to adopt the same internal structure as that of the second illumination optical system 7 in order to substantially evenly illuminate the predetermined surface 4. However, since the light beams which illuminate the predetermined surface 4 do not require the high homogeneity like that of the light beams illuminating the phase shifter 8, a relatively simple structure can be adopted in the first illumination optical system 3.

In both the first illumination optical system and the second illumination optical system, any other method than one described above, e.g., a method using a Koehler illumination which does not utilize fly-eye lenses, a rod type optical integrator or the like can be adopted. Further, it is also effective to homogenize the light intensity distribution in a surface direction of the predetermined surface 4 by inserting a scatter plate (41) according to needs.

The light beams via the predetermined surface 4 are transmitted through the beam splitter 9, and then enter a processed substrate 11 through an image formation optical system 10. The light beams via the phase shifter 8 are reflected by the beam splitter 9, and then the processed substrate 11 is irradiated with these beams through the image formation optical system 10. That is, the light beams through the predetermined surface 4 and the light beams via the phase shifter 8 are combined by the beam splitter 9 as light beam combining means, predetermined image formation characteristics are given to the combined light beams by the image formation optical system 10, and an image of the combined light beams is formed on the processed substrate 11.

The processed substrate 11 is obtained by sequentially forming an underlying film and an amorphous silicon film on, e.g., a liquid crystal display glass sheet by chemical vapor deposition. The processed substrate 11 is held at a predetermined position on a substrate stage 12 by a vacuum chuck or an electrostatic chuck.

Furthermore, in this embodiment, there is provided a measuring instrument 13 in order to measure a light intensity distribution which is formed in a predetermined area on the semiconductor film of the processed substrate 11.

The image formation optical system 10 may be a refractive type optical system, a reflective type optical system or a refractive/reflective type optical system. For example, it is possible to use a projection method by which the processed substrate 11 is set apart from a surface optically conjugate with the phase shifter 8 in relation to the image formation optical system 10 by a predetermined distance (defocus quantity) along an optical axis. According to this method, a defocus quantity is set to a necessary value in such a manner that the light beams via the phase shifter 8 generate a light intensity distribution with an inverse peak pattern on the semiconductor film of the processed substrate 11. Furthermore, the processed substrate 11 and the phase shifter 8 may be arranged so as to be optically conjugate with each other through the image formation optical system 10. According to this method, an image side numerical aperture of the image formation optical system 10 is set to a necessary value in such a manner that the light beams through the phase shifter 8 generate a light intensity distribution with an inverse peak pattern on the semiconductor film of the processed substrate 11.

In this manner, the beam source 1, the beam splitter 2, the first illumination optical system 3, the beam splitter 9 and the image formation optical system 10 constitute a first irradiation system which is used to irradiate a predetermined area on the semiconductor film on the processed substrate 11 with the light beams having a substantially homogeneous light intensity distribution.

Moreover, the beam source 1, the beam splitter 2, the second illumination optical system 7, the phase shifter 8, the beam splitter 9 and the image formation optical system 10 constitute a second irradiation system which is used to irradiate a predetermined area on the semiconductor film of the processed substrate 11 with the light beams having a light intensity distribution with an inverse peak pattern that a light intensity is increased toward the periphery from an area in which the light intensity is minimum.

Figure 3:
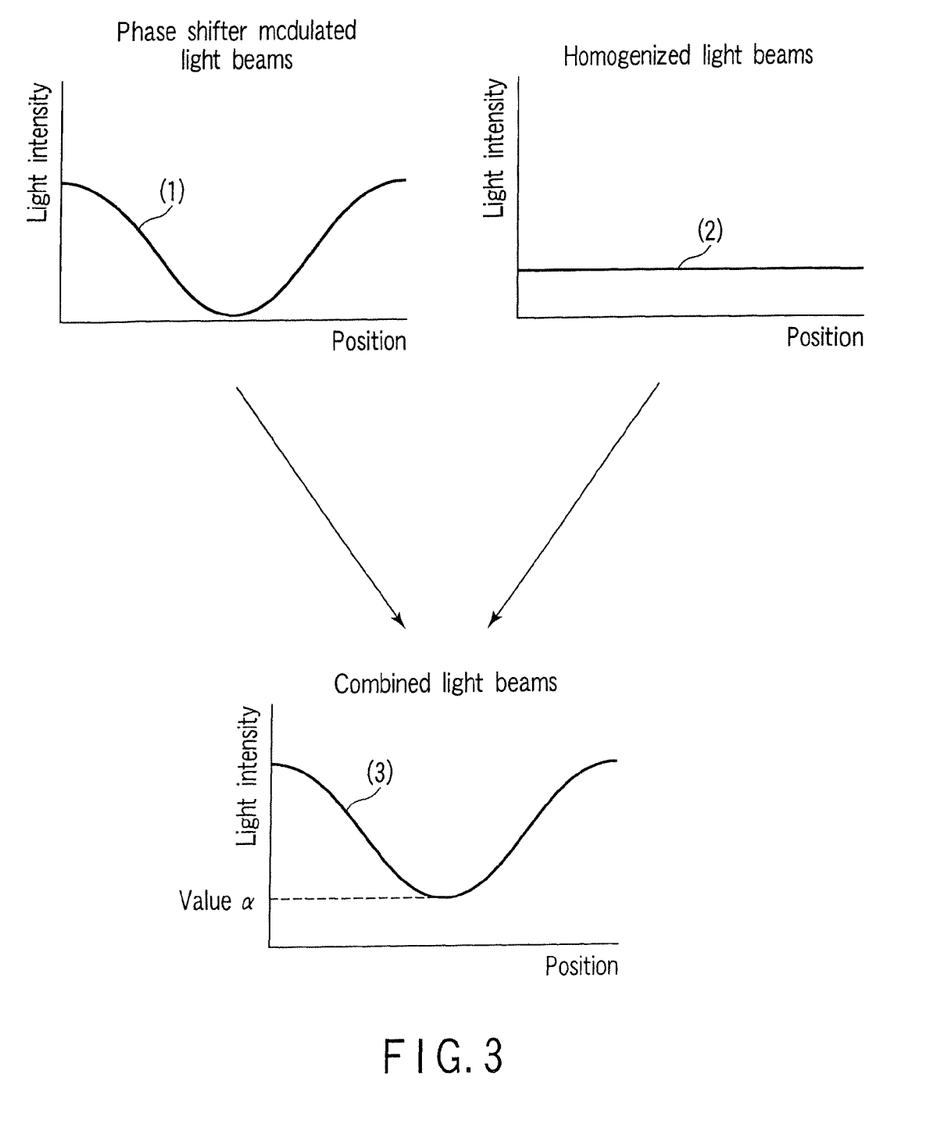
FIG. 3 is a schematic view illustrating a basic effect of the present invention.

FIG. 3 is a view illustrating a light intensity distribution formed on the semiconductor film of the processed substrate in this embodiment.

A description will now be given with reference to FIGS. 1 to 3.

The second irradiation system forms a light intensity distribution with an inverse peak pattern that the light intensity is increased toward the periphery from the center having a light intensity close to an inverse peak value 0 in a predetermined area on the semiconductor film of the processed substrate 11, as shown in a first segment (1) in FIG. 3.

On the other hand, the first irradiation system forms a substantially homogeneous light intensity distribution in a predetermined area on the semiconductor film of the processed substrate 11, as shown in a second segment (2) in FIG. 3.

Therefore, in this embodiment, the light beams emitted from the second irradiation system and modulated by the phase shifter 8 and the homogenized light beams emitted from the first irradiation system are combined in a predetermined area on the semiconductor film of the processed substrate 11.

The combined light beams correspond to light beams obtained by increasing the value α in the first segment (1) by a homogeneous light quantity in the second segment (2).

The combined light beams have a light intensity distribution with an inverse peak pattern that the light intensity is increased toward the periphery from the value α of the inverse peak value having the light intensity which is minimum but substantially larger than zero.

The "value α" means an absolute value, and the "value α(standardized value)" means a value obtained by standardizing a maximum value of the light intensity as 1 hereinafter.

Figure 4A:
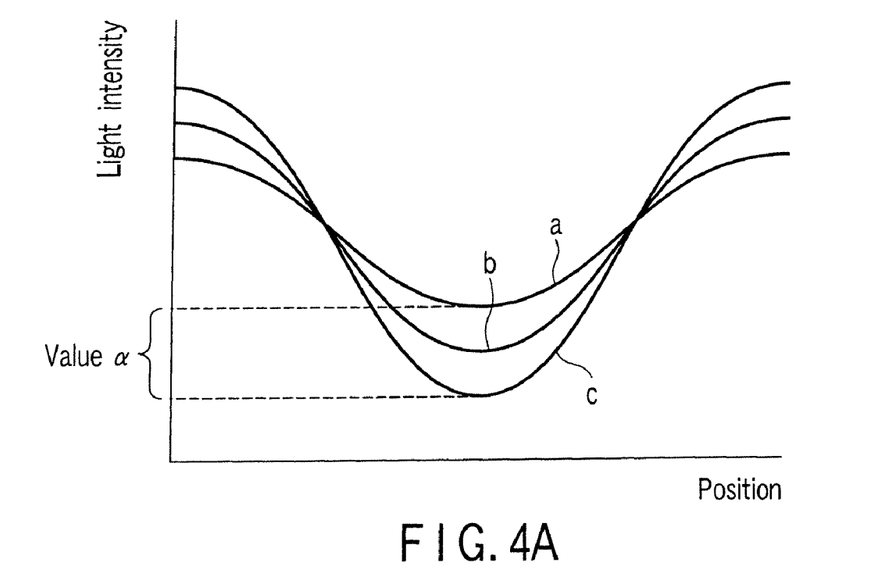
FIGS. 4A and 4B are schematic views respectively illustrating basic effects of the present invention.
Figure 4B:
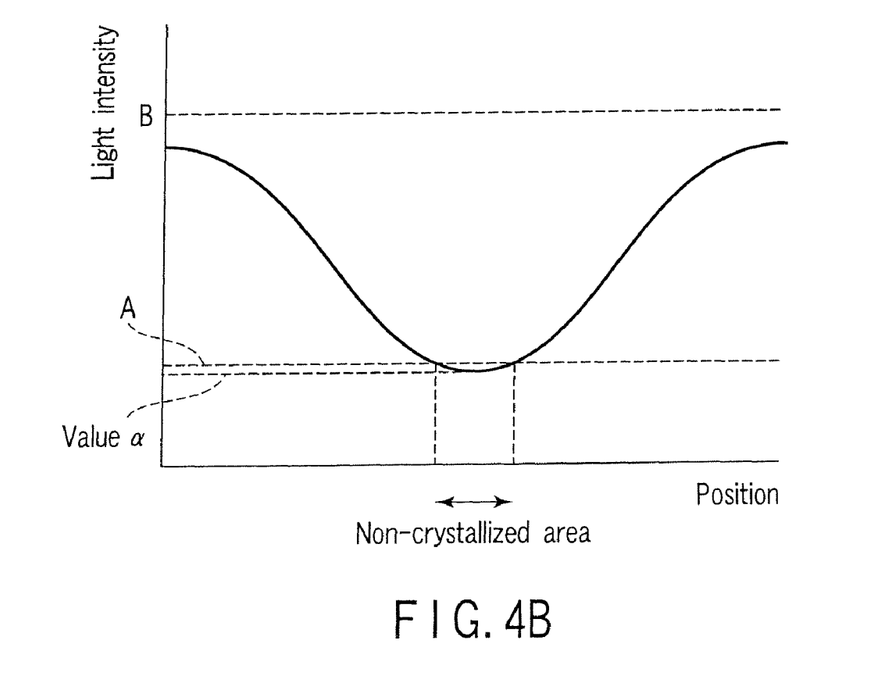

FIGS. 4A to 4B are views illustrating a basic effect of this embodiment, and a relationship between the value α and the first reference intensity A in the combined light beams.

This embodiment is characterized in that the intensity of the light beams which are transmitted through the phase shifter and have a modulated light intensity (which will be referred to as modulated light beams hereinafter) is changed by varying an intensity of homogenized light beams by replacing the beam splitter 2 with an arbitrary beam splitter having a different reflectance.

As a result, as shown in FIG. 4A, there can be obtained curves a, b and c representing light intensity distributions with three inverse peak patterns that the value α is reduced in order in each light intensity distribution with the inverse peak pattern. The inverse peak means a minimum value of a curve which protrudes downward in each of the curves a, b and c representing the light intensity distribution with the inverse peak pattern. This minimum value is represented by the value α in FIG. 4A.

In this manner, the plurality of replaceable beam splitters 2 with various reflectances constitute intensity ratio varying means used to vary an intensity ratio of the homogenized light beams from the first irradiation system and the modulated light beams (whose intensity is modulated by the phase shifter) from the second irradiation system. Furthermore, the value α can be adjusted by using the effect of this intensity ratio varying means without changing the properties of the light intensity distribution with the inverse peak pattern (without changing a position of the inverse peak, a position of the maximum intensity and others).

Figure 8:
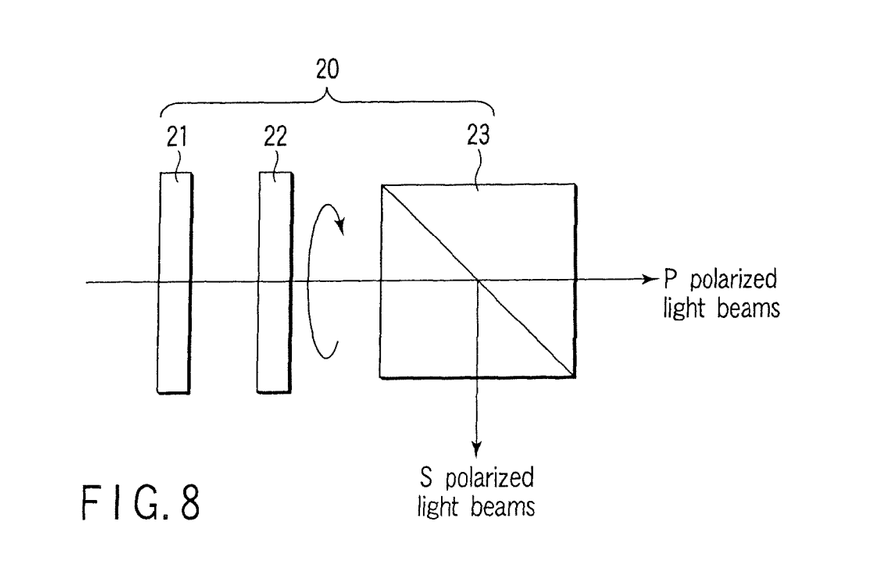
FIG. 8 is a schematic view illustrating an example of a structure of light beam dividing means.

In this embodiment, the light intensity distribution on the semiconductor film of the processed substrate 11 is measured by using, e.g., the measuring instrument 13, the beam splitter 2 is changed over in accordance with a measurement result, and an intensity ratio of the homogenized light beams shown in the second segment (2) in FIG. 3 and the modulated light beams obtained by the phase shifter 8 shown in the first segment (1) in FIG. 8 is changed. As a result, as shown in FIG. 4B, there can be obtained a light intensity distribution with an inverse peak pattern that the value α is slightly smaller than a non-crystallized limit intensity A and the maximum intensity is smaller than the ablation limit intensity B. In this case, a relatively small non-crystallized area is first formed, a crystal nucleus is generated around that non-crystallized area, and a crystal with a large particle size grows in the lateral direction from this crystal nucleus toward the periphery.

Moreover, since the maximum intensity in the light intensity distribution with the inverse peak pattern is smaller than the ablation limit intensity B, the semiconductor amorphous silicon or the polycrystal silicon is not lost due to ablation.

In this manner, it is possible to realize the sufficient lateral crystal growth from a crystal nucleus based on a desired light intensity distribution and generate a crystallized semiconductor film having a large particle size without substantially producing ablation in this embodiment.

In this embodiment, in order to obtain a light intensity distribution required to realize the sufficient lateral crystal growth from a crystal nucleus without substantially producing ablation, it is important for the value α (standardized value) to satisfy the following conditional expression (1).

$$0.2 \leq \text{value}\alpha \leq 0.8 \tag{1}$$

Incidentally, in order to improve upon the advantages of the present invention, it is preferable to set an upper limit value and a lower limit value of the conditional expression (1) to optimum values in accordance with a wavelength to be used, a light intensity, a semiconductor film structure and a light intensity distribution.

In this embodiment, a light intensity distribution acquired on the semiconductor film of the processed substrate 11 is actually obtained by simulation according to a specific numerical example. In this numeral example, it is assumed that a wavelength λ of the light beams is 248 nm, the imaging formation optical system 10 is an equal-magnification optical system, and an object side numerical aperture of the image formation optical system 10 is 0.031. Additionally, it is assumed that a numerical aperture of the second illumination system 7 is 0.0155 so that an illumination sigma becomes 0.5.

Further, the line type (areas with different phase values are linearly defined) phase shifter 8 comprises two areas which are alternately repeated with a pitch of 10 μm along one direction, and it is assumed that a phase difference of 180 degrees is given between these two areas. In more detail, there is provided an irradiation target in which an $SiO_2$ (lower insulating layer) layer having a thickness of 300 nm is formed on a glass plate having a thickness of, e.g., 0.7 mm, an a-Si layer having a thickness of 200 nm is formed on the $SiO_2$ layer and an $SiO_2$ layer (upper insulating layer) having a thickness of 300 nm is provided thereon. That is, the irradiation target is a glass substrate to which an a-Si film used to grow an Si crystal with a large particle size in a predetermined direction is provided.

A description will now be given as to reasons that the value α (standardized value) should desirably take a range of the expression (1).

In regard to a change in the a-Si film on the glass substrate when the glass substrate (irradiation target) having the a-Si film provided thereto is irradiated with KrR excimer laser beams (wavelength: 248 nm), the a-Si film remains in a-Si and crystallization does not occur in case of not more than 200 $mJ/cm^2$, and the a-Si film is turned to p-Si (polysilicon) or a crystal state (c-Si) in case of more than 200 $mJ/cm^2$ to not more than 1000 $mJ/cm^2$.

On the other hand, when the a-Si film is irradiated with the excimer laser beams which exceed 1000 mJ/cm$^2$ (peak value at an irradiation position), it can be recognized that a-Si and p-Si (fine crystal) are lost due to ablation as described above. Therefore, a peak value of the light intensity is determined as 1000 mJ/cm$^2$ in the following description. However, in a practical sense, since a margin due to irregularities in thickness of the a-Si layer, irregularities in thickness of the glass substrate or fluctuations in a distance between the glass substrate and the irradiation optical system must be taken into consideration, the above value is inappropriate as an optimum value, and hence it is desirable to set a slightly smaller value.

First, a lower limit value of the value α should be not less than 200 mJ/cm$^2$ which can turn a-Si into p-Si or enable crystallization of the same. Even in case of not less than 200 mJ/cm$^2$, the crystal growth does not occur with a value having a relatively low intensity, and a-Si is turned to p-Si. However, since p-Si has a higher electron mobility than a-Si although lower than that of crystallized Si (c-Si), the above value is desirable. Therefore, it is desirable to set the value α (standardized value) to be not less than 0.2 (=200/1000). Furthermore, an upper limit value of the value α is determined as 1000 mJ/cm$^2$ (peak value at the irradiation position) based on the above-described result.

The upper limit value of the value α (standardized value) will now be described with reference to FIGS. 5A and 5B.

Figure 5A:
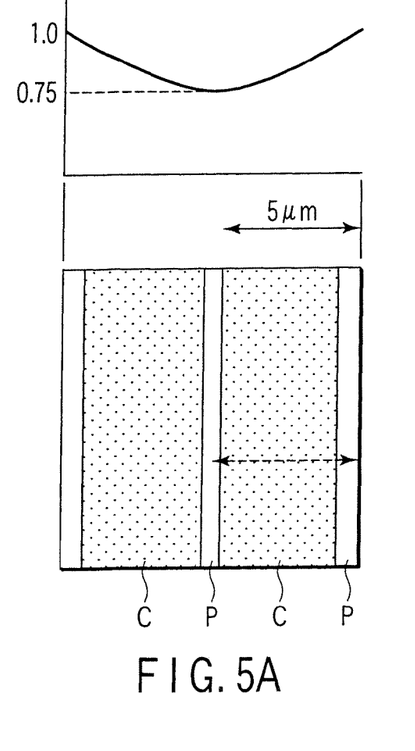
FIGS. 5A and 5B are schematic views illustrating a factor used to set an upper limit value of a value "$\alpha$" described in conjunction with FIGS. 3, 4A and 4B.
Figure 5B:
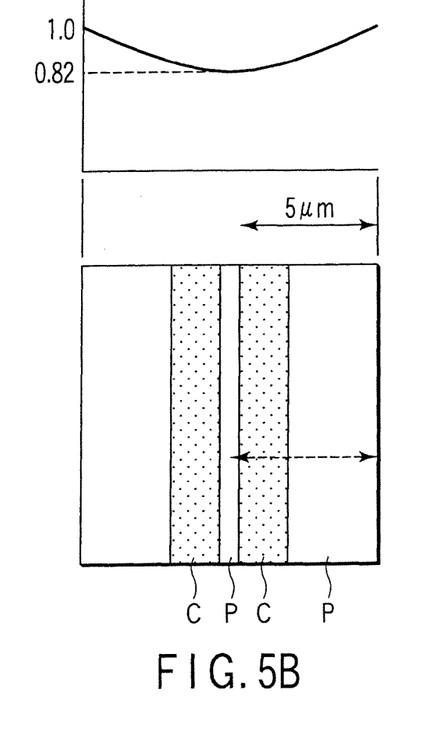

FIGS. 5A and 5B show sizes of a p-Si area and a crystal growth area on the glass substrate obtained by emitting light beams having the value α (standardized value) set to 0.75 and 0.82 in the vicinity of center (border part of the phase value) by using the phase shifter having a length from the center to an end being 5 μm.

It is to be noted that setting the length from the center to the end to 5 μm in the phase shifter is beneficial to arrange, e.g., TFTs (thin film transistors) with a pitch of 10 μm.

As apparent from FIG. 5A, when the excimer laser beams having the value α (standardized value) of 0.75 are emitted, p-Si (fine crystal) P is confirmed in a boundary part of the phase value, and crystallized areas C with a large particle size due to crystal growth are confirmed on the both sides of p-Si P in the substantially entire area excluding trailing end portions.

As apparent from FIG. 5B, when the excimer laser beams having the value α (standardized value) of 0.82 are emitted, p-Si (fine crystal) P is generated at a boundary part of the phase value, and crystallized areas C having a large particle size due to crystal growth can be confirmed on the both sides of p-Si P, but its size (superficial content) is small.

Therefore, the value α (standardized value) should be set to 0.8 or smaller value with which the substantially entire area can be turned to the crystallized area.

A relationship between a size (superficial content) of the crystallized area C and the value α (standardized value) will now be described in more detail with reference to FIG. 5C.

Figure 5C:
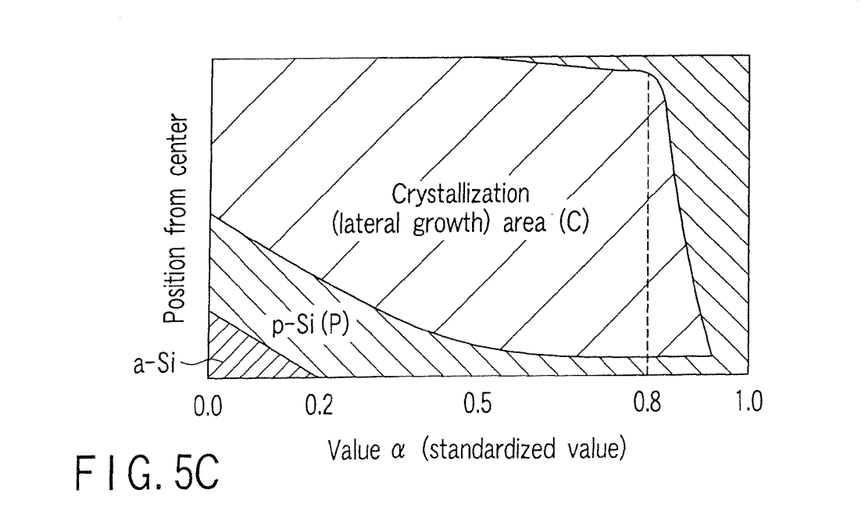
FIG. 5C is a schematic view illustrating an example that an intensity, i.e., the value $\alpha$ of laser beams which can be written based on FIGS. 5A and 5B and a-Si in an irradiated object (glass substrate having a thin film of a-Si formed thereto) vary.

FIG. 5C illustrates a type of a crystal defined based on the value α (standardized value) described above in conjunction with FIGS. 5A and 5B and a distance from the vicinity of the center of the phase shifter (boundary part of the phase value).

As apparent from FIG. 5C, when the value α is smaller than 0.2, areas of a-Si and p-Si are formed over a very large area in the vicinity of the center of the phase shifter.

Further, in an area where the value α (standardized value) exceeds 0.2 and it is approximately 0.5, there is no a-Si in the vicinity of the center of the phase shifter, but an area with a certain extent is occupied by p-Si.

Furthermore, in an area where the value α (standardized value) exceeds 0.5 and is approximately 0.8, it can be recognized that mainly p-Si (fine crystal) P is determined as a crystal nucleus and a crystallized area C having a large particle size due to the crystal growth is obtained.

On the other hand, when the value α (standardized value) exceeds 0.8, a size (superficial content) of the crystallized area C having a large particle size due to the crystal growth with p-Si (fine crystal) P as a crystal nucleus is suddenly decreased, and there is only mainly p-Si (fine crystal).

That is, when the laser beams that the value α (standardized value) can be set to approximately 0.5 to 0.8 are emitted in FIG. 5C, crystallization advances with a high filling ratio from p-Si (fine crystal) to a crystal with a large particle size. Therefore, it is adequate to determine that a temperature gradient (heating condition) which is preferable to facilitate crystallization from a crystal nucleus (p-Si (fine crystal)) to a crystal with a large particle size can be obtained.

On the other hand, when the laser beams that the value α (standardized value) can be set to 0.8 or above are emitted, it is adequate to consider that a large temperature gradient suitable for the crystal growth from a crystal nucleus cannot be obtained (temperature gradient close to a temperature increasing speed which generates ablation is produced).

Based on this, it is preferable for the value α (standardized value) of the laser beams to be emitted to the above-described glass substrate (irradiation target) to fall within a range of the expression (1), i.e., $0.2 \leq \alpha \leq 0.8$.

Moreover, the value α (standardized value) is preferably $0.5 \leq \alpha \leq 0.8$.

Figure 6A:
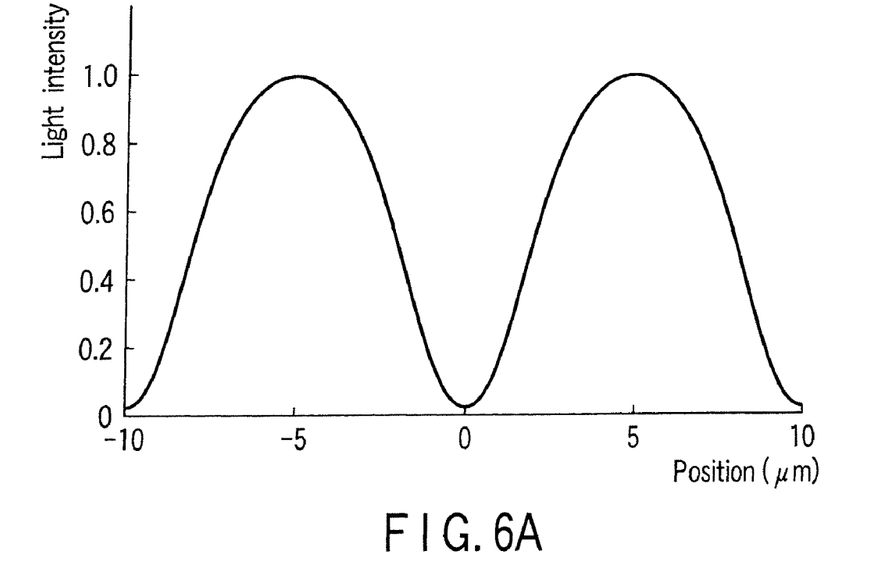
FIGS. 6A and 6B are schematic views illustrating a light intensity distribution obtained by phase shifter modulated light beams and a light intensity distribution obtained by homogenous light beams.
Figure 6B:
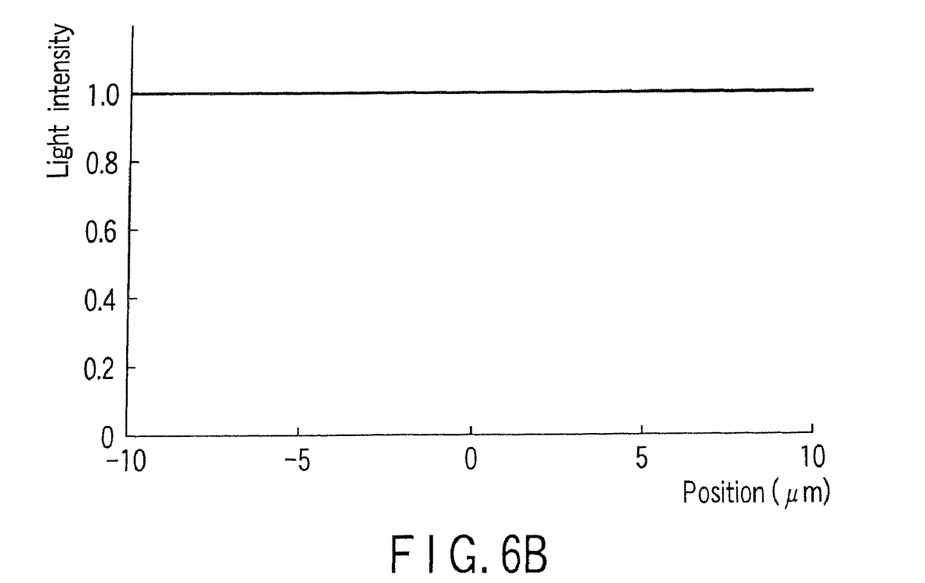

FIG. 6A shows a light intensity distribution obtained on the semiconductor film of the processed substrate 11 by using the phase shifter modulated light beams in a numerical example. FIG. 6B shows a light intensity distribution obtained on the semiconductor film of the processed substrate 11 by using the homogeneous light beams in the numerical example.

In FIG. 6A, a maximum value of a light intensity in a light intensity distribution with an inverse peak pattern is standardized as 1. Likewise, in FIG. 6B, a maximum value of a light intensity in a substantially homogeneous light intensity distribution is standardized as 1. In the numerical example, an intensity ratio of the homogenized light beams and the phase shifter modulated light beams is set in such a manner that an actual value of the maximum light intensity in the light intensity distribution shown in FIG. 6A becomes equal to an actual value of the maximum light intensity in the light intensity distribution depicted in FIG. 6B.

Figure 7:
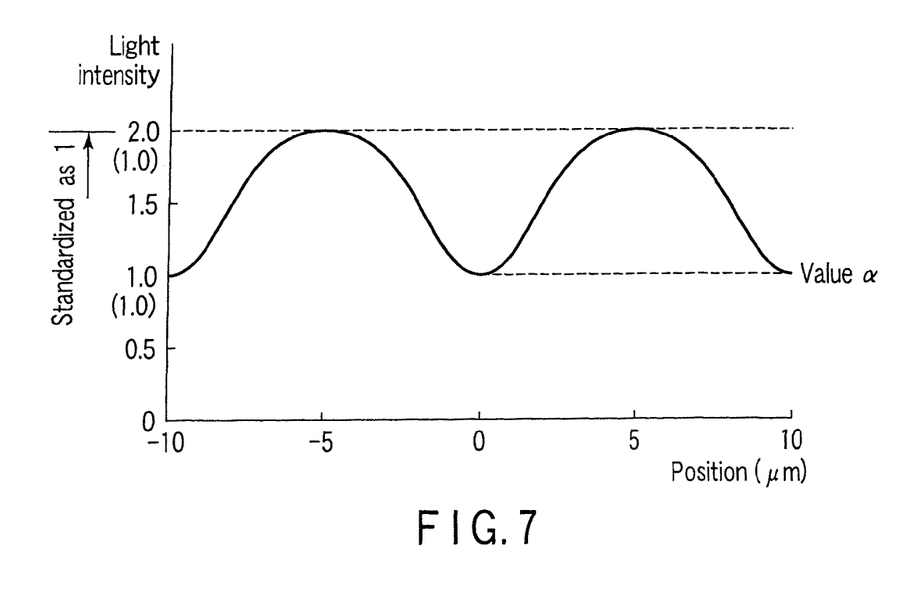
FIG. 7 is a schematic view showing a light intensity distribution obtained as combined light beams of phase shifter modulated light beams and homogenous light beams.

As a result, combining the phase shifter modulated light beams having the light intensity distribution shown in FIG. 6A with the homogenized light beams having the light intensity distribution depicted in FIG. 6B can obtain such a light intensity distribution with an inverse peak pattern as illustrated in FIG. 7 on the semiconductor film of the processed substrate 11.

In FIG. 7, although a vertical axis on the left-hand side corresponds to vertical axes of FIGS. 6A and 6B, the maximum value of the light intensity in the light intensity distribution of the combined light beams is standardized as 1 on the right-hand side. Referring to FIG. 7, it can be understood that a desired light intensity distribution with the value α (standardized value) being, e.g., approximately 0.5 is obtained in accordance with this embodiment. It is to be noted that the intensity ratio of the homogenized light beams and the phase shifter modulated beams is changed by replacing the beam splitter 2 as the light beam dividing means with another beam splitter having a different reflectance in the above-described embodiment.

However, the present invention is not restricted thereto, and the beam splitter 2 with a different transmittance may be used, or the beam splitter 9 as the light beam combining means may be replaced with a beam splitter having a different reflectance or transmittance in order to change the intensity ratio. Additionally, the intensity ratio can be changed by replacing the both beam splitters 2 and 9 with other beam splitters having different reflectances.

Further, although the beam splitter 2 is used as the light beam dividing means in the foregoing embodiment, the present invention is not restricted thereto, and various modifications can be effected with respect to a structure of the light beam dividing means.

FIG. 8 is a view schematically showing a structure of a modification of the light beam dividing means.

Referring to FIG. 8, light beam dividing means 20 according to the modification comprises a deflecting plate 21, a ½ wavelength plate 22 which is rotatable around the optical axis and a polarized beam splitter 23 from a light incident side.

In the light beam dividing means 20, the laser beams from the beam source 1 enter the polarized beam splitter 23 through the deflecting plate 21 and the ½ wavelength plate 22. The light beams reflected by the polarized beam splitter 23 reach the processed substrate 11 as S polarized light beams through the first illumination optical system 3, the beam splitter 9 and the image formation optical system 10. On the other hand, the light beams transmitted through the polarized beam splitter 23 reach the processed substrate 11 as P polarized light beams through the second illumination optical system 7, the phase shifter 8, the beam splitter 9 and the image formation optical system 10.

In the light beam dividing means 20 of the modification, an intensity ratio of the reflected light beams and the transmitted light beams can be changed in the polarized beam splitter 23 by rotating the ½ wavelength plate 22 around the optical axis. Incidentally, in cases where the light beam dividing means 20 of the modification is used, it is preferable to utilize the polarized beam splitter in place of the beam splitter 9 in order to suppress light quantity losses in combination of the P polarized light beams and the S polarized light beams.

Figure 9A:
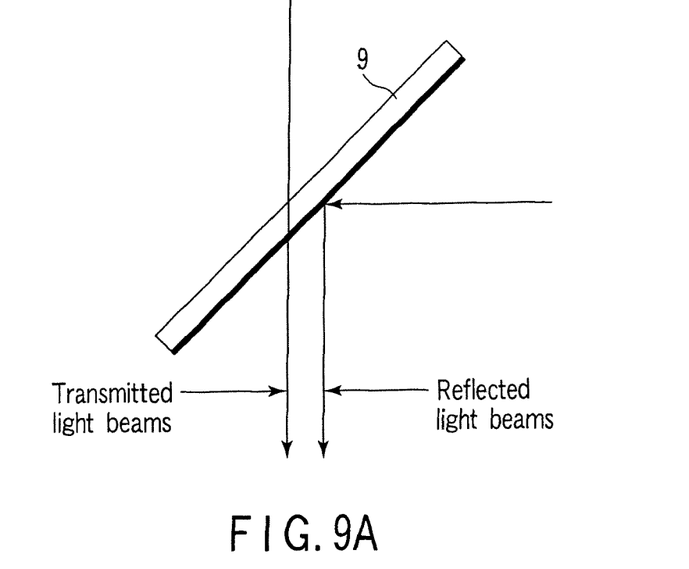
FIGS. 9A and 9B are schematic views showing occurrence of an aberration in the light beam dividing means and emission of the phase shifter modulated light beams and the homogeneous light beams from different directions.

Meanwhile, when a mirror type beam splitter 9 having, e.g., a dielectric multilayer film formed thereto is used as the light beam combining means, aberrations tend to be generated in the transmitted light beams due to the affect of a thickness of the substrate as shown in FIG. 9A. Therefore, in order to substantially prevent the phase shifter modulated light beams from being substantially affected by aberrations in the beam splitter 9, it is preferable to set the light beams from the phase shifter 8 to be reflected by the beam splitter 9. Furthermore, it is desirable to provide a light path difference larger than a coherence length of the laser beams between the phase shifter modulated light beams and the homogenized light beams in order to prevent an unnecessary interference band from being produced when combining the phase shifter modulated light beams with the homogenized light beams in the beam splitter 9.

Although the first irradiation system and the second irradiation system comprise the common beam source 1 in the foregoing embodiment, the present invention is not restricted thereto, and it is possible to adopt a structure in which the first irradiation system and the second irradiation system comprise different beam sources. In this case, although an arrangement of the light beam dividing means can be eliminated, the intensity ratio of the homogenized light beams and the phase shifter modulated light beams must be changed by replacing the beam splitter 9 as the light beam combining means with, e.g., another beam splitter having a different reflectance.

Figure 9B:
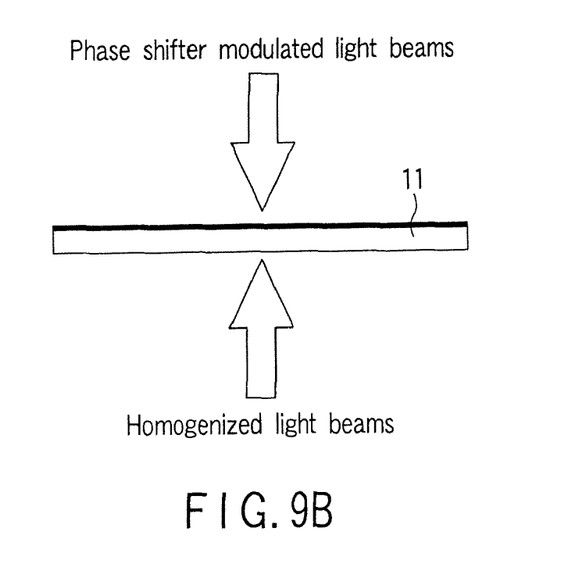

Although the first irradiation system and the second irradiation system comprise the common image formation optical system 10 in the foregoing embodiment, the present invention is not restricted thereto, and it is possible to employ a structure in which the first irradiation system and the second irradiation system comprise different image formation optical systems. For example, as shown in FIG. 9B, it is good enough for the first irradiation system and the second irradiation system to emit light beams to the processed substrate from directions different from each other. In order to avoid the affect of aberrations due to a thickness of the processed substrate, it is beneficial to irradiate the processed substrate with the phase shifter modulated light beams from the semiconductor film side, as shown in FIG. 9B.

Although the light intensity distribution can be calculated on a design stage in the foregoing embodiment, it is desirable to observe and confirm the light intensity distribution on the actual processed surface. In order to realize this, it is good enough to use, e.g., the measuring instrument 13, magnify the processed surface of the processed substrate 11 by using the optical system and input a result by an imaging element such as a CCD. When light beams to be used are ultraviolet rays, the optical system has restraints, and hence a fluorescent screen may be provided to the processed surface to convert the light beams into visible light beams.

FIGS. 10A to 10E are process cross-sectional views showing steps of manufacturing an electronic device in an area crystallized by using the crystallization apparatus according to this embodiment.

Figure 10A:
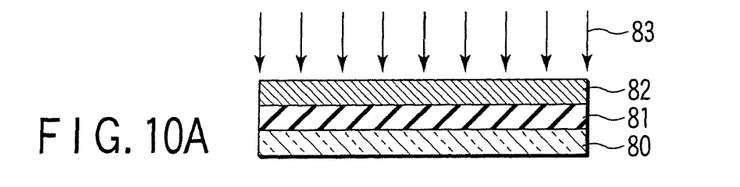
FIGS. 10A to 10E are schematic views showing steps to manufacture an electronic device on a semiconductor film crystallized by using a crystallization apparatus according to the present invention.

As shown in FIG. 10A, there is prepared a processed substrate 11 obtained by forming an underlying film 81 and an amorphous semiconductor film 82 on an insulating substrate 80 by using a chemical vapor deposition method or a sputtering method. It is possible to use, e.g., alkali glass, quartz glass, plastic, polyimide or the like for the insulating substrate 80. Furthermore, it is preferable to use SiN having a film thickness of 50 nm and an $SiO_2$ lamination film having a film thickness of 100 nm for the underlying film 81. Moreover, it is preferable to use, e.g., Si, Gi or SiGe having a film thickness of approximately 50 nm to 200 nm for the amorphous semiconductor film 82.

Then, a part or all of the surface of the amorphous semiconductor film 82 is irradiated with laser beams 83 (e.g., KrF excimer laser beams or XeCl excimer laser beams) by using the crystallization apparatus shown in FIG. 1. The laser beams 83 which can be used in the crystallization apparatus shown in FIG. 1, i.e., the phase shifter modulated light beams and the homogenized light beams are provided by the above-described arbitrary laser beams or a combination of these laser beams.

Figure 10B:
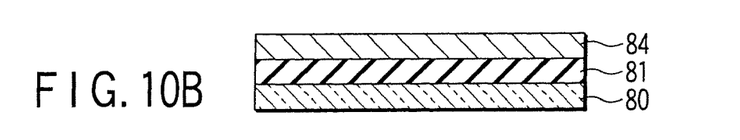
Figure 10C:
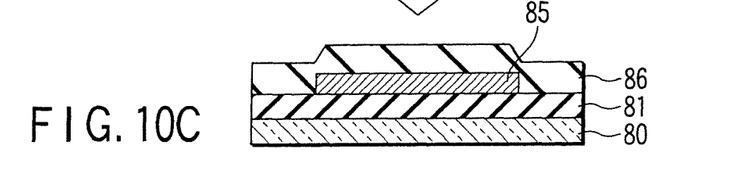
Figure 10D:
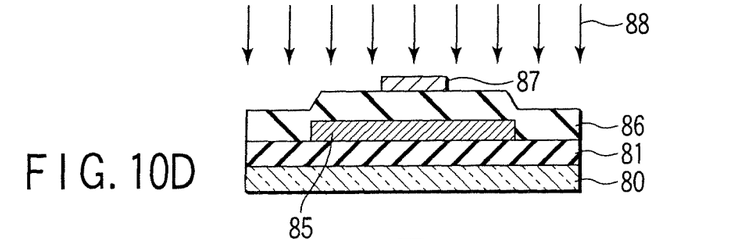

In this manner, as shown in FIG. 10B, there is generated a polycrystal semiconductor film or a single-crystallized semiconductor film 84 having a crystal with a large particle size. Then, as shown in FIG. 10C, the polycrystal semiconductor film or the single-crystallized semiconductor film 84 is processed into an island-shaped semiconductor film 85 by using the photolithography technique, and an $SiO_2$ film having a film thickness of 20 to 100 nm is formed as a gate insulating film 86 by using the chemical vapor deposition method or the sputtering method. Moreover, as shown in FIG. 10D, a gate electrode 87 (e.g., silicide or MoW) is formed, and impurity ions 88 (phosphor in case of an N channel transistor, boron in case of a P channel transistor) are implanted with the gate electrode 87 being used as a mask.

Figure 10E:
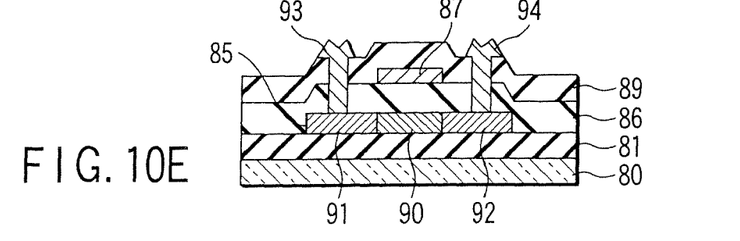

Thereafter, annealing processing (e.g., for one hour at 450° C.) is performed in a nitrogen atmosphere, thereby activating the impurities. Then, as shown in FIG. 10E, contact holes are provided by forming an interlayer insulating film 89, and a source electrode 93 and a drain electrode 94 connected with a source 91 and a drain 92 which are coupled through a channel 90 are formed.

In the above-described steps, a channel 90 is formed in accordance with a position of a crystal with a large particle size of the polycrystal semiconductor film or the single-crystallized semiconductor film 84 generated in the steps shown in FIGS. 10A and 10B. Based on the above-described steps, a polycrystal transistor or a single-crystallized semiconductor transistor can be formed.

The thus manufactured polycrystal transistor or single-crystallized transistor can be applied to a drive circuit of, e.g., a liquid crystal display or an EL (electroluminescence) display or an integrated circuit of, e.g., a memory (SRAM or DRAM) or a CPU.

As described above, in the crystallization apparatus and the crystallization method according to the present invention, the light beams having the substantially homogeneous light intensity distribution are combined with the light beams having the light intensity distribution with the inverse peak pattern in a predetermined area of the polycrystal semiconductor film or the amorphous semiconductor film. As a result, in the present invention, the sufficient lateral growth from a crystal nucleus can be realized and a crystallized semiconductor film with a large particle size can be generated without substantially producing ablation.

Incidentally, according to this crystallization apparatus of the present invention, there can be obtained a desired light intensity distribution which can realize the sufficient lateral growth from a crystal nucleus based on a relatively small amorphous area without substantially producing ablation.

Moreover, according to this crystallization apparatus of this invention, the value α can be adjusted to fall within an appropriate range by changing an intensity ratio by using intensity ratio variable means without substantially varying properties of the light intensity distribution with the inverse peak pattern.

Additionally, according to this crystallization apparatus of the present invention, the value α can be adjusted to fall within an appropriate range by changing an intensity ratio by using light beam dividing means without substantially varying properties of the light intensity distribution with the inverse peak pattern.

Further, according to this crystallization apparatus of the present invention, the beam source can be used in common, and the first irradiation system and the second irradiation system can be relatively simply configured.

Furthermore, according to this crystallization apparatus of the present invention, the predetermined area can be irradiated with the light beams from different directions by the first irradiation system and the second irradiation system.

Moreover, according to this crystallization method of the present invention, there can be obtained a desired light intensity distribution which can realize the sufficient lateral growth from a crystal nucleus based on a relatively small amorphous area without substantially generating ablation.

Additionally, there can be obtained a semi-conductor device or a liquid crystal display device with excellent characteristics which can operate at a high speed by using a crystallized semiconductor film with a large particle size obtained by realizing the sufficient lateral growth from a crystal nucleus acquired by the crystallization apparatus and the crystallization method according to the present invention.

The present invention is not limited to the embodiments described above and can be modified in various manners without departing from the spirit and scope of the invention.

What is claimed is:

1. A crystallization method which generates a crystallized semiconductor film by irradiating at least one of a polycrystal semiconductor film and an amorphous semiconductor film with light beams having a light intensity distribution with an inverse peak pattern such that a light intensity is increased toward the periphery from an inverse peak at which the light intensity is minimum, wherein a light intensity value α (standardized value) in the inverse peak when a maximum value of the light intensity in the light intensity distribution with the inverse peak pattern is standardized as 1 is set to $0.2 \leq$ value $\alpha \leq 0.8$.

2. A crystallization method which generates a crystallized semiconductor film by irradiating at least one of a polycrystal semiconductor film and an amorphous semiconductor film with light beams having a predetermined light intensity, comprising:

irradiating a predetermined area of at least one of the polycrystal semiconductor film and the amorphous semiconductor film with a first light beam having a substantially homogeneous light intensity distribution; and irradiating the predetermined area with a second light beam having a light intensity distribution with an inverse peak pattern such that a light intensity is increased toward the periphery from an area in which the light intensity is minimum, concurrently with at least the first light beam having the substantially homogeneous light intensity distribution or within a range of a predetermined time difference, wherein when a maximum value of a light intensity of a light beam synthesized from the first light beam having the substantially homogeneous light intensity distribution and the second light beam having the light intensity distributing with the inverse peak pattern is standardized as 1, a light intensity value α (standardized value) in the inverse peak is set to $0.2 \leq$ value $\alpha \leq 0.8$.

* * * * *